United States Patent [19]

Kwock et al.

[11] Patent Number: 5,589,424
[45] Date of Patent: Dec. 31, 1996

[54] PHOTODEFINABLE DIELECTRIC LAYERS COMPRISING POLY(AROMATIC DIACETYLENES)

[75] Inventors: Elizabeth W. Kwock, Califon; Timothy M. Miller, New Providence, both of N.J.

[73] Assignee: Lucent Technologies Inc., Murray Hill, N.J.

[21] Appl. No.: 543,900

[22] Filed: Oct. 17, 1995

Related U.S. Application Data

[62] Division of Ser. No. 173,284, Dec. 22, 1993.

[51] Int. Cl.$^6$ ............................................. H01L 21/312
[52] U.S. Cl. .......................... 437/229; 526/247; 526/253; 526/292.9; 526/293; 526/313; 526/333; 526/334; 528/205
[58] Field of Search ...................... 526/285, 247, 526/253; 528/205; 437/229

[56] References Cited

U.S. PATENT DOCUMENTS

| | | | |
|---|---|---|---|
| 4,667,006 | 5/1987 | Ai | 526/285 |
| 4,767,797 | 8/1988 | Ai | 522/8 |

*Primary Examiner*—Fred Zitomer
*Attorney, Agent, or Firm*—Richard J. Botos

[57] ABSTRACT

Applicants have discovered an improved photodefined dielectric materials comprising poly(aromatic diacetylenes). The preferred poly(aromatic diacetylenes) are copolymers of aromatic diacetylenes. Specific examples are 1) a copolymer of 4,4'-diethynyldiphenyl ether and m-diethynyl benzene and 2) a copolymer of 4,4'-diethynyldiphenyl ether and 4,4'-bis(3-ethynylphenoxy)-2,2',3,3',5,5',6,6'-octafluorobiphenyl. These copolymers can be photochemically crosslinked in patterns with exposure of 30 mJ/cm$^2$ μm and 60 mJ/cm$^2$ μm, respectively, and patterns have been produced in 10 μm thick films with features as small as 12 μm.

3 Claims, 2 Drawing Sheets

FIG. 2A
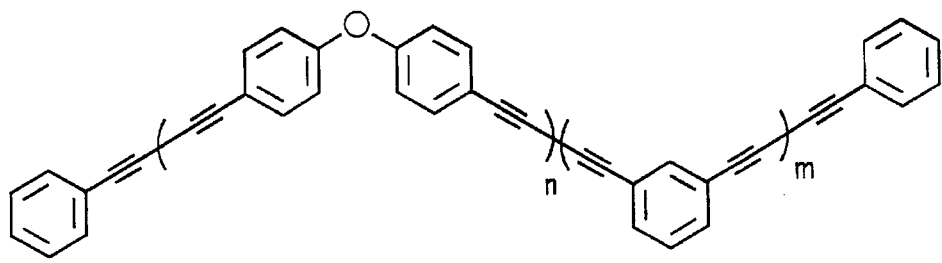
FIG. 2B
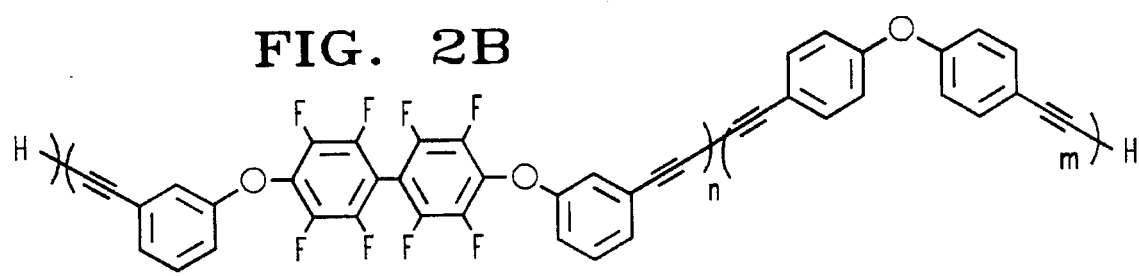
FIG. 3A
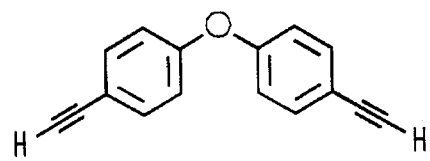
FIG. 3B
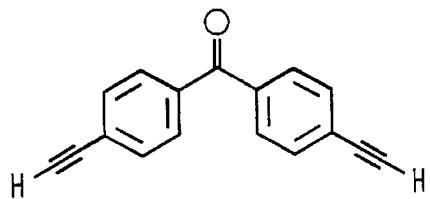
FIG. 3C
FIG. 3D
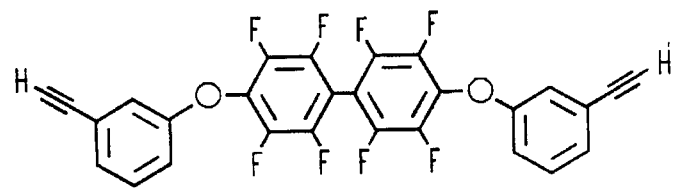

5,589,424

PHOTODEFINABLE DIELECTRIC LAYERS COMPRISING POLY(AROMATIC DIACETYLENES)

This is a division of application Ser. No. 08/173284 filed Dec. 22, 1993.

FIELD OF THE INVENTION

This invention relates to photodefinable dielectric layers for use in the fabrication of electronic circuits and, in particular, to photodefinable dielectric layers comprising poly(aromatic diacetylenes).

BACKGROUND OF THE INVENTION

There is a substantial need in the microelectronics industry for high quality, photodefinable dielectric materials. In many applications, such as in multichip modules, the dielectric polymer is ideally tough, resistant to thermoxidation, adherent and has good insulating capability. An ideal material exhibits low moisture absorption, a high dielectric constant and a low coefficient of thermal expansion. The material should be capable of low temperature processing, simple photodefinability and preferably be applicable from solution.

Polyimides, the materials conventionally used, leave much to be desired. Polyimides typically require high curing temperatures on the order of 300° C. and evolve water during curing. They have high moisture absorbance which makes their dielectric constant vary with humidity. Accordingly, there is a need for an improved material for making photodefinable layers.

SUMMARY OF THE INVENTION

Applicants have discovered an improved photodefined dielectric materials comprising poly(aromatic diacetylenes). The preferred poly(aromatic diacetylenes) are copolymers of aromatic diacetylenes. Specific examples are 1) a copolymer of 4,4'-diethynyldiphenyl ether and m-diethynyl benzene and 2) a copolymer of 4,4'-diethynyldiphenyl ether and 4,4'-bis(3-ethynylphenoxy)-2,2',3,3',5,5',6,6'-octafluorobiphenyl. These copolymers can be photochemically crosslinked in patterns with exposure of 30 mJ/cm² μm and 60 mJ/cm² μm, respectively, and patterns have been produced in 10 μm thick films with features as small as 12 μm.

BRIEF DESCRIPTION OF THE DRAWINGS

The advantages, nature and various additional features of the invention will appear more fully upon consideration of the illustrative embodiments now to be described in detail in connection with the accompanying drawings. In the drawings:

FIGS. 2A and 2B illustrate poly(aromatic diacetylenes) useful as improved photodefinable dielectrics in accordance with the invention;

FIGS. 3A–3D illustrate monomers useful in making the poly(aromatic diacetylenes) of FIGS. 2A and 2B.

Figure 1A:
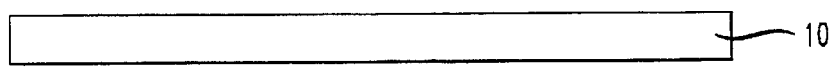
FIGS. 1A–1F are a sequence of schematic cross sections illustrating the conventional use of photodefinable dielectrics in the fabrication of multichip modules.
Figure 1B:
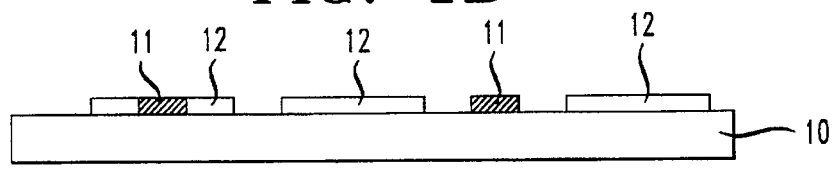

It is to be understood that these drawings are for purposes of illustrating the concepts of the invention and are not to scale.

DETAILED DESCRIPTION

Referring to the drawings, FIGS. 1A through 1F are a sequence of schematic cross sections illustrating the conventional use of photodefinable dielectrics in the fabrication of multichip modules. These illustrations are useful in showing how the photodefinable dielectric of the invention can be used.

Figure 1C:
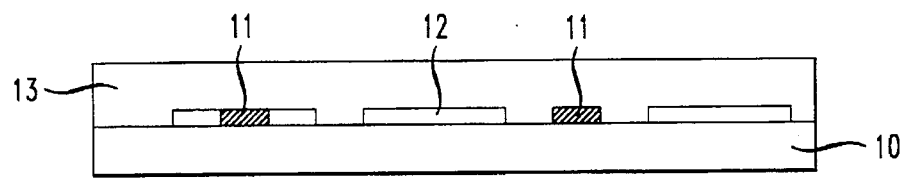
Figure 1D:
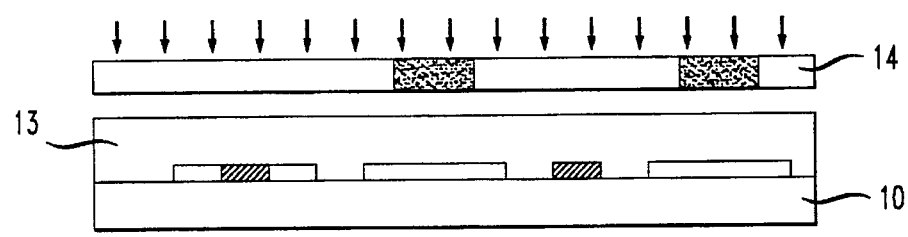
Figure 1E:
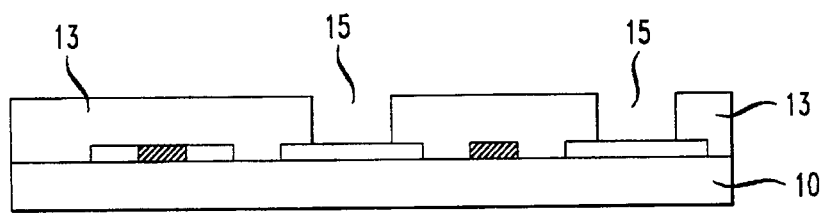
Figure 1F:
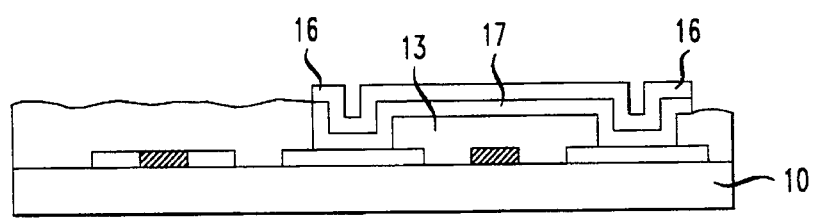

As shown in FIG. 1A, the fabrication of a multichip module typically begins with provision of a substrate 10 such as a substrate of ceramic, polymer or silicon. The next step shown in FIG. 1B involves forming on substrate 10 a pattern of conductors 11 and resistors 12 by conventional photolithographic processes. The third step shown in FIG. 1C is to apply as by spinning or spraying a layer of photodefinable dielectric material 13 covering the conductors and resistors. The dielectric is then exposed through an appropriate mask 14 as shown in FIG. 1D and developed as shown in FIG. 1E to provide openings 15 to components to be contacted. The developed polymer is cured, e.g., thermally, and cleaned. And metal contacts 16, 17 are applied using conventional photolithographic techniques as shown in FIG. 1F. Optionally the process can be continued by a new layer of photodefinable dielectric (not shown) and repeating the process using the dielectric as a substrate.

In accordance with the present invention, a photodefinable material useful, for example, as layer 13 is a poly(aromatic diacetylene) and preferably is a copolymer of aromatic diacetylenes, such as copolymers of diethynyldiphenyl ether and diethynyl benzene. FIG. 2A is a structural formula of a preferred copolymer comprising a copolymer of 4,4' diethynyldiphenyl ether and m-diethynyl benzene. As a second example, the photodefinable material can be a copolymer of diethynyldiphenol ether and a ethynylphenol such as a monomer derived from 3-ethynylphenol via nucleophilic aromatic substitution. FIG. 2B is structural formula of a preferred copolymer comprising 4,4' diethynyldiphenyl ether and 4,4'-bis(3-ethynylphenoxy)-2,2',3,3',5, 5,5',6,6'-octafluorobiphenyl.

The poly(aromatic diacetylenes) of FIGS. 2A and 2B have excellent properties for use as photodefinable dielectrics. They can be photochemically crosslinked in patterns with exposures of 30 mJ/cm² μm and 60 mJ/cm² μm, respectively, and patterns have been produced in 10 μm thick films with features as small as 12 μm. The FIG. 2A polymer oxidizes slowly at temperatures above 200° C. in air, and the FIG. 2B polymer is stable to oxidation and can be stretched 90% before breaking. Both polymers are hydrophobic and absorb less than 1% of their weight in water. The coefficients of thermal expansion are about 50 pm, and both adhere to Au, Ag, $Al_2O_3$ and Si. They have dielectric constants of 3.34 and 2.82, respectively.

In use, the polymer of FIG. 2A can be dissolved in cyclohexanone for spinning applications of 6 μm thick films in a single coating. (For the FIG. 2A polymer, solutions of up to 15 wt/wt % are stable up to 4 hours. 5% solutions are stable for several weeks. For the FIG. 2B polymer 25 wt/wt % solutions are stable for several weeks.) After spin-on, the coated substrates are preferably placed in an oven for a soft bake to remove the solvent leaving smooth, transparent, tack-free films.

After baking, the films can be exposed through an appropriate mask. The most practical source for exposure is the 365 nm (g-line) emission of a mercury lamp. A dose of approximately 200 mJ/cm² is required to gel a 7 μm thick film of the FIG. 2A polymer whereas 100 mJ/cm² gels a 6.5 μm thick film of the FIG. 2B polymer. The contrast ratio as defined by the initial slope of the sensitivity curve is about 1.8 for FIG. 2A and 2 for FIG. 2B. At the largest doses examined, the FIG. 2A polymer retained its original thickness whereas the FIG. 2B plymer retained 85% of its original thickness.

The exposed films can be developed in cyclohexanone. A combination of 65° C. bake temperature and a 22° C. development temperature produced the best images with the FIG. 2A polymer. The same conditions can be used with the FIG. 2B polymer which is less sensitive to bake and solvent temperatures.

The poly(aromatic diacetylenes) of FIGS. 2A and 2B can be synthesized from the monomers depicted in FIGS. 3A through 3D. The FIG. 2A polymer a random sequence (designated n,m) of the monomers of FIGS. 3A and 3B. The preferred ratio is n/m=3/1. Similarly, the FIG. 2B polymer can be a random sequence of the monomers of FIGS. 3C and 3D. Preferably n/m=3/1. The synthesis of these monomers is described fully and in detail in Kwock et al., "Synthesis and Characterization of Soluble, High Molecular Weight Poly(aromatic diacetylenes)," 26 *Macromolecules*, No. 11, pp. 2935–40 (1993), which is incorporated herein by reference.

Polymerization was effected using the procedure described by D. M. White, *Poly. Prepr.* (Am. Chem. Soc., Div. Polym. Chem.) 1971, 12(1), 155 which is also incorporated herein by reference. Specifically, the procedure of White was followed using CuCl, N, N, N', N'-tetramethylethylenediamine, and pyridine at 80° C. in o-dichlorobenzene at polymer concentrations of 6% (wt/vol). Phenylacetylene was used as an endcapping agent to limit molecular weights, thus preventing solutions from becoming too viscous. Reaction mixtures containing soluble polymers were generally diluted with p-dioxane and precipitated into methanol containing concentrated HCl. The polymers were isolated by filtration, washed with methanol and dried.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

We claim:

1. In the method of making a multichip module comprising the steps of providing a substrate, applying conductors and resistors to a surface of the substrate, applying a layer of photodefinable dielectric material to said surface, exposing selected portions of said layer to light and developing the exposed layer to define a pattern of dielectric, the improvement wherein:

said photodefinable dielectric material comprises a copolymer of diethynyldiphenyl ether and an aromatic diacetylene.

2. The method of claim 1 wherein the diethynyldiphenyl ether is 4,4' diethynyldiphenyl ether.

3. The method of claim 1 wherein the aromatic diacetylene is selected from the group consisting of m-diethynyl benzene, diethynylbenzyl ketone, and 4,4'-bis(3-ethynylphenoxy)-2,2',3,3',5,5',6,6'-octafluorobiphenyl.

* * * * *